(12) United States Patent
Fricker

(10) Patent No.: US 9,380,702 B2
(45) Date of Patent: Jun. 28, 2016

(54) SERVER SYSTEM WITH INTERLOCKING CELLS

(71) Applicant: Advanced Micro Devices, Inc., Sunnyvale, CA (US)

(72) Inventor: Jean-Philippe Fricker, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 219 days.

(21) Appl. No.: 13/888,724

(22) Filed: May 7, 2013

(65) Prior Publication Data

US 2014/0334084 A1    Nov. 13, 2014

(51) Int. Cl.
| | |
|---|---|
| *H05K 1/11* | (2006.01) |
| *H05K 1/14* | (2006.01) |
| *H05K 5/00* | (2006.01) |
| *G06F 1/18* | (2006.01) |
| *H05K 7/14* | (2006.01) |
| *H05K 7/00* | (2006.01) |
| *H05K 3/46* | (2006.01) |

(52) U.S. Cl.
CPC *H05K 1/14* (2013.01); *G06F 1/181* (2013.01); *G06F 1/183* (2013.01); *G06F 1/184* (2013.01); *H05K 5/0021* (2013.01); *H05K 7/1417* (2013.01); *H05K 7/1487* (2013.01); *H05K 7/1489* (2013.01); *H05K 1/144* (2013.01); *H05K 3/4691* (2013.01); *H05K 2201/047* (2013.01); *H05K 2201/2072* (2013.01)

(58) Field of Classification Search
CPC .......... G06F 1/181; G06F 1/183; G06F 1/184
USPC .............. 361/679.01, 679.02, 724, 725, 726, 361/727, 728, 729, 730, 731, 732, 735, 361/747; 312/223.1, 223.2, 223.3
See application file for complete search history.

(56) References Cited

U.S. PATENT DOCUMENTS

| | | | | |
|---|---|---|---|---|
| 5,329,418 | A | * | 7/1994 | Tanabe ........................ 361/695 |
| 5,737,189 | A | * | 4/1998 | Kammersgard .......... G06F 1/18 312/107.5 |
| 2002/0097563 | A1 | * | 7/2002 | Costner ..................... G06F 1/18 361/735 |

(Continued)

OTHER PUBLICATIONS

U.S. Appl. No. 13/495,325, filed Jun. 13, 2012, entitled "Contactless Interconnect".

(Continued)

*Primary Examiner* — Hoa C Nguyen
*Assistant Examiner* — Binh Tran

(57) ABSTRACT

A server system includes an array of server cells. Some or all of the server cells include a set of at least three side panels forming an enclosure and a compute component comprising a processor core. At least one side panel of each server cell is removably mechanically coupled and removably electrically coupled to a facing side panel of an adjacent server cell. The enclosure may form a triangular prism enclosure, a cuboid enclosure, a hexagonal prism enclosure, etc. The enclosure can be formed from a rigid flex printed circuit board (PCB) assembly, whereby the side panels are implemented as rigid PCB sections that are interconnected via flexible PCB sections, with the flexible PCB sections forming corners between the rigid PCB sections when the rigid-flex PCB assembly is folded into the enclosure shape. The compute component and other circuit components are disposed at the interior surfaces of the rigid PCB sections.

24 Claims, 11 Drawing Sheets

(56) References Cited

U.S. PATENT DOCUMENTS

2010/0321880 A1* 12/2010 Yeo ............................ G06F 1/20
                                                                    361/679.46
2012/0151098 A1*  6/2012 Sullivan ................ G06F 1/1607
                                                                    710/13

OTHER PUBLICATIONS

U.S. Appl. No. 13/530,958, filed Jun. 22, 2012, entitled "Electronic Interconnect Method and Apparatus".

Computerwire, "IBM goes Lego with Ice Cube storage, server prototypes", Jan. 3, 2003, [[http://www.theregister.co.uk/2003/01/03/ibm_goes_lego_with_ice/]], 3 pages.

Mark Gallant, "Guide to Rigid-Flex Design", Oct. 1, 2006, [[http://pcdandf.com/cms/magazine/172/2948-guide-to-rigid-flex-design?tmpl=component&print=1&page=]], 7 pages.

Rick Merritt, "IBM stacks hard-disk bricks to build dense storage cube", EE Times, Apr. 23, 2002, [[http://eetimes.com/electronics-news/4165609/IBM-stacks-hard-disk-bricks-to-build-dense-storage-cube]], 3 pages.

Jean-Daniel Nicoud, Smaky.ch, A History of Computing in Switzerland, "Chapter 3—Logidules the Microdules and NovaSim", Accessed May 7, 2013, [[www.smaky.ch/chapitre.php?id=lami_3]], 2 pages.

W. W. Wilcke et al., "IBM Intelligent Bricks project—Petabytes and beyond", IBM J. Res. & Dev. vol. 50 No. 2/3, Mar. 1, 2006, 17 pages.

* cited by examiner

SERVER SYSTEM WITH INTERLOCKING CELLS

BACKGROUND

1. Field of the Disclosure

The present disclosure relates generally to processing systems and more particularly to server systems.

2. Description of the Related Art

Multiple-processor, or multiple-node, server systems conventionally are implemented in a blade server or rack server configuration whereby multiple server blades or server sleds are interconnected via a backplane or midplane. While enabling inter-node connectivity, the use of a midplane or backplane can interrupt airflow, thereby putting the server components in jeopardy of overheating. Moreover, because the backplane or midplane serves as the inter-node connection system for all nodes, the number of nodes supported in such systems is limited by the connectivity available from the particular midplane or backplane implemented in the system. Such systems also are difficult to scale as their expandability typically is limited to expansion in only one dimension, as well as being limited to the dimensions of the rack due to their reliance on the rack for structural support.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items. Orientation-related or positioning terms, such as "left," "right", "top," "bottom", "front", "back", are relative to the orientation in the corresponding drawing and are used merely for ease of reference.

DETAILED DESCRIPTION

Figure 1:
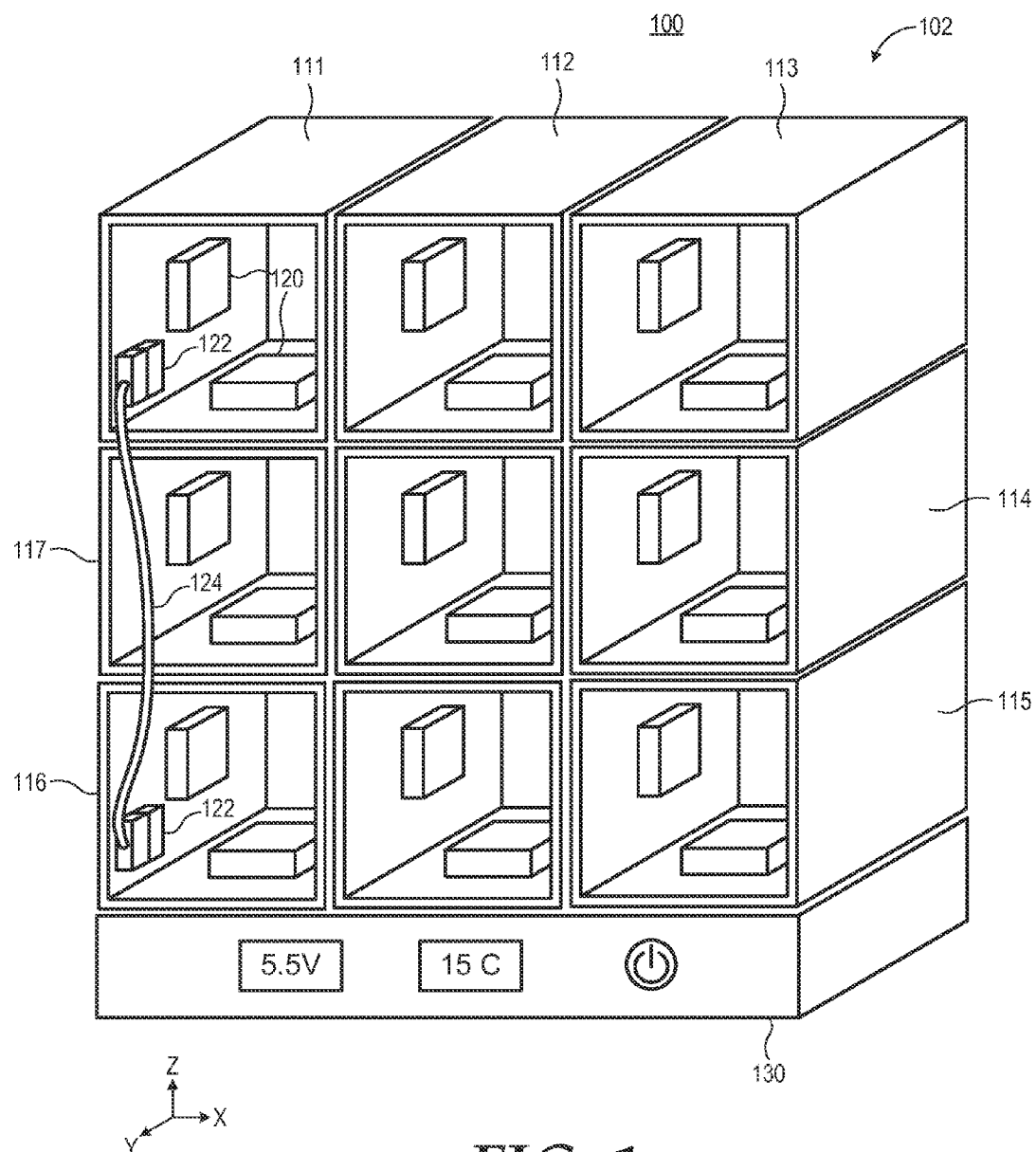
FIG. 1 is a perspective view of a cell-based server system comprising a two-dimensional array of server cells in accordance with some embodiments.

FIGS. 1-13 illustrate techniques pertaining to a cell-based server system. In some embodiments, the server system comprises an array of interlocking server cells that may be structurally self-supporting. Each server cell operates as a separate node in the system and has a cell enclosure containing the electronic components of the node, such as one or more processors, memory, an interconnect controller, and the like. The cell enclosure is formed of a plurality of side panels. The exterior surfaces of two or more side panels of the cell body include mechanical coupling assemblies to facilitate their mechanical coupling with adjacent server cells. Some or all of the exterior mating surfaces of the cell enclosure also can include electrical connectors for providing or receiving supply voltages or for conducting signaling with adjacent server cells. In some embodiments, the signaling connectors are implemented as contact connectors, whereas in other embodiments, the signaling connectors are implemented as contactless connectors. Some or all of the server cells further can include jumper interfaces to receive jumper cabling so as to facilitate connectivity between non-adjacent server cells (that is, server cells that are separated by one or more intervening server cells). The cell enclosure, in some embodiments, is open at one side or open at two opposing sides, thereby facilitating air flow. In some embodiments, the server cell is formed from printed circuit board (PCB) sections that are connected or otherwise arranged into one of a variety of shapes, such as a cell enclosure with side panels forming a cuboid shape, a triangular prism shape, a pentagonal prism shape, a hexagonal prism shape, a heptagonal prism shape, an octagonal prism shape, and the like.

A server system may be formed from such server cells by interlocking the server cells in a specified arrangement so as to form an array of server cells attached via their side panels in a manner similar to the cells, or alveoli, of a honeycomb. The distribution of power among the server cells thus may be conducted via side panels of adjacent server cells. Interconnectivity of the server cells likewise may be achieved via signaling conducted between the side panels of adjacent server cells. As such, signaling and power may be routed through the server cell array without the need for a midplane or backplane. In some embodiments, the server cells are removably coupleable so as to be reconfigurable into a new arrangement or so that a server cell may be swapped in place, or "field swappable." Two server cells thus may be joined through a slide-fit coupling process or a press-fit coupling process. The side panels of the cell enclosure may be fabricated, connected, or internally braced so that the interlocked server cells are structurally self-supporting, thereby facilitating modification of the server system to include more or fewer server cells as appropriate. Further, the server cells may be configured so as to permit server cells to be interconnected in a one-dimensional array (e.g., a row or column of server cells), a two-dimensional array (e.g., a wall or rank of server cells), or a three-dimensional array (e.g., a cube of server cells).

FIG. 1 illustrates a cell-based server system 100 in accordance with some embodiments. The server system 100 may be implemented to provide any of a variety of server functions, such as a database services, simulation or modeling services, web hosting or video hosting services, and the like. The server system 100 supports the provision of such services through the use of an array 102 of interlocked server cells. In the depicted example, the server system 100 comprises a two-dimensional (2D) array of server cells having nine server cells arranged in 3 columns and 3 rows, including server cells 111, 112, 113, 114, 115, 116, and 117. However, it will be appreciated that the array 102 can include more or fewer server cells, as well as different dimensions, such as a one-dimensional array of server cells arranged in either a row or a column, or, as illustrated in greater detail with reference to FIG. 8, a three-dimensional array of server cells arranged in multiple ranks, each rank comprising multiple rows and columns of server cells.

Each server cell comprises computing componentry 120 to perform computing operations in support of the services provided by the server system 100. For at least some of the server cells, this computing componentry 120 comprises one or more processor cores to perform computing operations. The one or more processor cores can include, for example, central processing units (CPUs), graphics processing units (CPUs), accelerated processing units (AR), a digital signal processor, and the like. In some instances, some of the computing componentry of a subset of the server cells instead may include peripheral support components, hard drive controllers, basic input/output system (BIOS) controllers, network interface controllers (NICs), and other input/output (I/O) controllers. The server cells further can include other support circuitry, such as data storage devices (e.g., disc drives and solid state drives), voltage regulators, AC-DC power supplies, DC-DC power supplies, input/output interfaces, discrete active or passive components (e.g., resistors, capacitors, and inductors), switches, buttons, and the like.

The server cells are interlocked together to form a substantially rigid structure that may be self-supporting in some implementations. To this end, each server cell comprises an enclosure formed from at least three side panels. The exterior surface of each of some or all of the side panels of this enclosure includes a mechanical coupling assembly that is compatible with the mechanical coupling assemblies of other server cells such that two server cells joined together in the proper orientation may be mechanically connected via the compatible mechanical coupling assemblies of their opposing mating exterior surfaces. Any of a variety of mechanical coupling assemblies may be implemented. For example, the mechanical coupling assemblies can interlock via a slide-fit relationship, such as through using a dovetail coupling assembly, interlock via a press-fit relationship, such as through using a pin-and-hole coupling assembly, or interlock through the use of adhesives, straps, hook-and-loop fasteners, clamps, magnets, bolts, and the like. In some embodiments, the mechanical coupling provided between server cells can be engaged, disengaged, and then re-engaged, thereby allowing the server cells to be removably interlocked and thus allowing reconfiguration of the assembly of the server cells and expansion of the array 102. In other embodiments, the mechanical coupling is substantially permanent, such as through the use of an adhesive.

In some embodiments, the server cells interact with each other to implement the services provided by the server system 100. To illustrate, the server system 100 may be used to implement a distributed compute operation whereby some or all of the server cells perform separate discrete compute operations in parallel in furtherance of the distributed compute operation. In such instances, the server cells may be considered as analogous to processors in a multiple-processor blade server or rack server. In other embodiments, some or all of the server cells operate independently; that is, they execute separate operating systems (OS), execute separate and independent programs, and/or operate on separate and independent data sets. In such instances, each server cell may be considered as analogous to a separate rack server or blade server. Further, in some instances, some of the server cells may operate as processing cells to perform compute operations and other server cells operate as input/output (I/O) cells to facilitate the communication of data and other signaling to and from storage devices, BIOS, and other peripheral devices on behalf of the processing cells, or to facilitate network communications with one or more external devices on behalf of the processing cells.

To facilitate data, command, and other signaling between server cells, the server cells are connected in a network topology, such as a ring network, a hub-and-spoke network, a torus network, a mesh network, and the like, or in a combination of network topologies. The links between the server cells in the intended network topology are implemented via electrical connectors disposed at the opposing mating surfaces of the side panels of the server cells. The electrical connectors can be implemented as contact-based connectors or contactless connectors. Contact-based connectors rely on physical contact to render an electrically conductive path between the signal connector on the mating surface of one server cell and the corresponding signal connector on the opposing mating surface of the adjacent server cell. Examples of contact-based connectors include metal pads, pins, metalized holes, spring-loaded metal connectors, and the like. Contactless connectors do not rely on physical contact to render a conductive path, but instead provide electrical conductivity via induction or capacitive coupling. An example contactless connector that may be employed is described in detail in U.S. patent application Ser. No. 13/495,325, entitled "Contactless Interconnect" and filed on Jun. 13, 2012, the entirety of which is incorporated by reference herein. As with inter-cell signaling, supply voltages may be distributed to the server cells of the array 102 via connectors coupled between opposing mating surfaces of the server cells.

In addition to providing interconnectivity via opposing mating surfaces of the enclosures of adjacent server cells, some or all of the server cells can implement a jumper interface 122 that mechanically and electrically couples to a jumper cable, thereby allowing two non-adjacent server cells (that is, two server cells with one or more other server cells in-between) to be directly connected via a jumper cable. Such jumper cables can be used to implement a particular network topology that is not easily achieved given the physical arrangement of the server cells. For example, as illustrated in FIG. 1 a jumper cable 124 connects the jumper interface 122 of the server cell 111 to the jumper interface 122 of the server cell 116, thereby allowing the server cells 111 and 116 to directly communicate without using the server cell 117 or another server cell as an intermediary. With the jumper cable 124, the server cells 111, 116, and 117 can be connected in a ring topology, with communications between server cells 111 and 117 occurring between the mating surfaces coupling the server cells 111 and 117, with communications between server cells 116 and 117 occurring between the mating surfaces coupling the server cells 116 and 117, and communications between the server cells 111 and 116 occurring via the jumper cable 124.

The server system 100 further can include a chassis 130 to support the operation of the array 102 of server cells. The chassis 130 can include, for example, one or more voltage supplies to provide the voltages used to power the server cells. The chassis 130 also can implement various peripheral components that may be used by the server cells, such as storage devices or network interfaces. In the depicted implementation, the chassis 130 is disposed at the bottom of the server cell array 102. In this configuration, the chassis 130 can include mechanical coupling assemblies compatible with the mechanical coupling assemblies of the server cells, thereby allowing the server cells in the bottom row to removably attach to the chassis 130, and thus helping to prevent the server cell array 102 from toppling over. Moreover, the chassis 130 can include electrical connectors on its top surface that electrically couple with corresponding connectors on the facing mating surfaces of the server cells of the bottom row so as to enable the chassis 130 to supply voltages to the server cell array 102, as well as to send or receive signaling from the server cell array 102. In other embodiments, the chassis 130 may be disposed at one of the left, right, or top sides of the server cell array 102. Further, the chassis 130 may have separate components at multiple sides of the server cell array 102. In some embodiments, the server cells are sufficiently rigid and the mechanical couplings between the server cells are sufficiently strong such that the server cell array 102 is self-supporting (that is, does not collapse, disconnect, or substantially deform under its own weight). In other embodiments, the chassis 130 can include one or more support structures (not shown), such as rods or beams, which may be attached to one or more of the top, bottom, left, or right sides of the server cell array 102 to provide some measure of structural support.

In the example of FIG. 1, the server cells have a cuboid shape. However, the server cells are not limited to this shape, but instead may include any of a variety of 3D shapes that provide exterior mating surfaces for interlocking with the mating surfaces of other server cells. Such shapes can include cuboids, cylinders, prisms (triangular, pentagonal, hexagonal, heptagonal, octagonal, etc.), and the like. The server system 100 also can employ combinations of different-shaped server cells. For example, the server system 100 can employ cuboid-shaped server cells interspersed among an array of octagonal-prism-shaped server cells, or triangular-prism-shaped server cells interspersed among an array of hexagonal-prism-shaped server cells.

In some embodiments, the server cells are fully enclosed; that is, there is a substantially complete panel at each side of the enclosure of the server cell. In such instances, each side of the server cell can include mechanical and electrical coupling assemblies to facilitate the interlocking of that side to a corresponding adjacent server cell. In other embodiments, the enclosures of the server cells may be substantially open at one or at two opposing sides. In the depicted example, the enclosures of the server cells are cuboids that are open at the front and rear sides ("front" and "rear" being relative to the orientation shown in FIG. 1). In this configuration, the top, bottom, left, and right side panels form a server cell enclosure to which up to four other server cells may be attached. With the front and rear of the server cell enclosures open, air can flow through the server cells relatively unimpeded, and thus the temperature of the server cells can be more readily regulated. Moreover, as the front of the server cell is open, the components of the server cell may be more readily accessed for test, repair, or replacement. In other configurations, the front side may be open while the rear side is closed, thereby allowing interlocking with another server cell via the rear side while still providing both ready access and some air flow into the server cell via the open front side.

Figure 2:
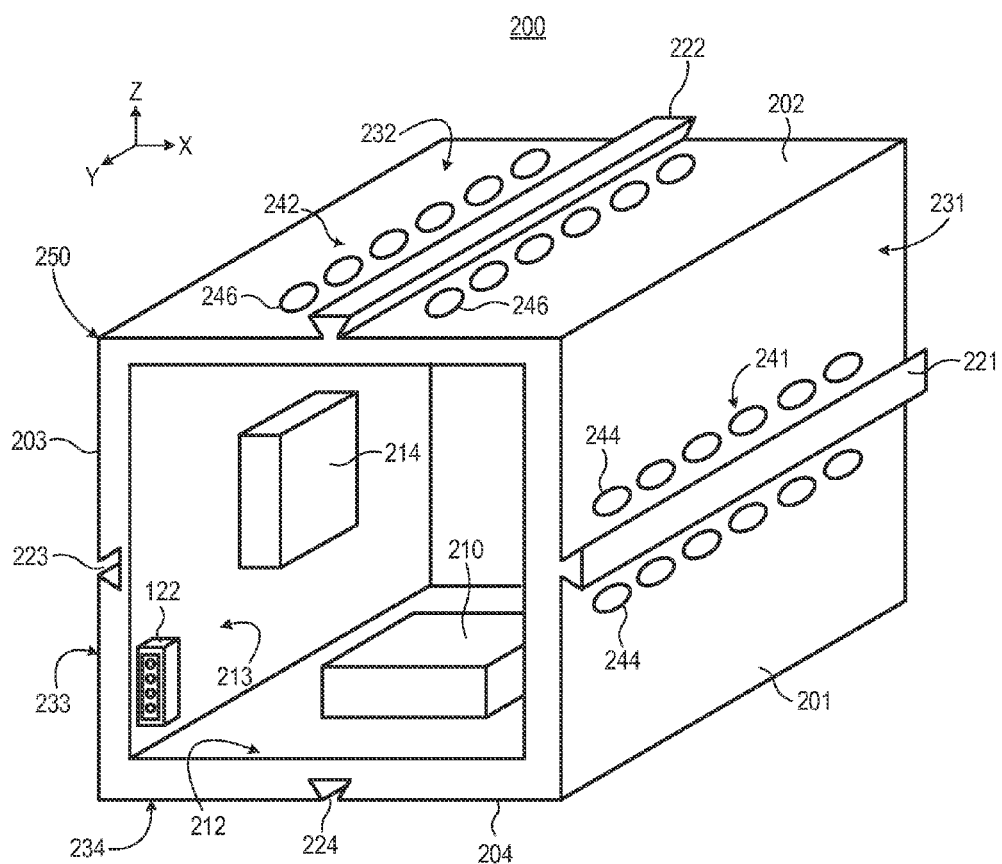
FIG. 2 is a perspective view of a server cell of the server system of FIG. 1 in accordance with some embodiments.

FIG. 2 illustrates a server cell 200 in accordance with some embodiments. The server cell 200 represents, for example, an example configuration of one or more of the server cells of the server system 100 of FIG. 1. In the depicted example, the server cell 200 has an enclosure 250 with an open cuboid shape that is formed by a right side panel 201, a top side panel 202, a left side panel 203, and a bottom side panel 204. The front and rear sides of the enclosure 250 are open in the example of FIG. 2. As described in greater detail below, the side panels of the server cell 200 may be formed from a PCB assembly comprising a set of rigid PCB sections electrically and mechanically attached via intervening flexible PCB sections.

The server cell 200 includes compute components disposed on one or more of the interior-facing surfaces of the enclosure 250. For example, a processor integrated circuit (IC) device 210 comprising one or more processor cores may be disposed at the interior surface 212 of the side panel 204 and an application specific integrated circuit (ASIC) 214 providing an interconnect controller for the server cell 200 may be disposed at the interior surface 213 of the side panel 203. The different compute components of the server cell 200 can be interconnected via metal traces, vias, and through holes embedded in the side panels 201-204, via insulated wiring (e.g., jumper wires) extending between pins of different components, and the like.

The exterior surfaces of one or more of the side panels 201-204 includes one or more mechanical coupling assemblies to permit the exterior surface to mechanically couple to a facing exterior surface of another server cell (or to a complementary mechanical coupling assembly on, for example, the chassis 130 of FIG. 1). In the depicted example, the server cell 200 employs a slide-fit coupling assemblies with a male slide-fit coupling assembly 221 disposed at the exterior surface 231 of the right side panel 201, a male slide-fit coupling assembly 222 disposed at the exterior surface 232 of the top side panel 202, a female slide-fit coupling assembly 223 disposed at the exterior surface 233 of the left side panel 203, and a female slide-fit coupling assembly 224 disposed at the exterior surface 234 of the bottom side panel 204.

In this example, a male slide-fit connector on the mating surface of one server cell 200 and a corresponding female slide-fit connector on the facing mating surface of another server cell 200 together form a dovetail joint that extends from front to back (i.e., along the illustrated Y-axis), whereby the male slide-fit connectors comprise a "pin" connector dimensioned so as to be compatible with the "tail" grooves formed as the female slide-fit connectors. In this configuration, two server cells 200 may be mechanically interlocked by inserting the rear end of a male slide-fit connector of one server cell 200 into the front end of a female slide-fit connector of the other server cell 200 (or by inserting the front end of a male slide-fit connector of one server cell 200 into the rear end of a female slide-fit connector of the other server cell 200) and then sliding the server cells 200 together along the illustrated Y axis. To illustrate, two server cells 200 can be interlocked vertically by sliding the male slide-fit coupling assembly 222 at the top side panel 202 of one server cell 200 into the female slide-fit coupling assembly 224 at the bottom side panel 204 of the other server cell. Similarly, two server cells 200 can be interlocked horizontally by sliding the male slide-fit assembly 221 at the right side panel 201 of one server cell 200 into the female slide-fit assembly 223 at the left side panel 203 of the other server cell 200. Although each exterior surface of the enclosure 250 is depicted as including a single male or female slide-fit coupling assembly, on other embodiments, some or all of the surfaces may include both male and female slide-fit coupling assemblies, or more than one type of slide-fit coupling assembly (e.g., two male assemblies). While a dovetail implementation is illustrated, other slide-fit coupling assemblies may be implemented, such as slide-fit coupling assemblies with circular, rectangular, or "T" shaped cross-sections. The slide-fit mechanical coupling of two adjacent server cells 200 is illustrated in greater detail below with reference to FIG. 3.

In other implementations, the mechanical coupling assemblies employed at the exterior surfaces of the server cells 200 in order to mechanically interlock two server cells 200 can include press-fit coupling assemblies, magnetic elements embedded at the side panels, hook-and-loop tape elements, clamp elements at the front or rear edges of the side panels 201-204, permanent or temporary adhesive, bolt elements and corresponding threaded bolt hole elements, and the like. An example press-fit mechanical coupling configuration is described in greater detail below with reference to FIG. 4.

Electrical coupling between server cells 200 for distribution of supply voltages or signaling is facilitated through the use of electrical connectors disposed at exterior surfaces of the server cells 200. For example, the illustrated server cell 200 includes a set 241 of electrical connectors 244 disposed in rows at the exterior surface 231 on both sides of the male slide-fit coupling assembly 221 and a set 246 of electrical connectors 244 disposed in rows at the exterior surface 232 on both sides of the female slide-fit coupling assembly 222. The other side panels 203 and 204 likewise can include sets of electrical connectors compatibly positioned. The electrical connectors at a mating surface are electrically coupled to the compute componentry of the server cell 200 or to the electrical connectors at another mating surface of the server cell 200 (for through routing of signaling or supply voltages) via, for example, metal vias and trace interconnects routed through the side panels of the server cell to the corresponding compute components, or via insulated metal wiring coupled to the metal connectors via holes extending from the interior surfaces of the side panels.

When two server cells 200 are interlocked together through their respective compatible mechanical coupling assemblies, electrical connectors disposed at the mating exterior surface of one of the server cells 200 electrically couple to corresponding electrical connectors disposed at the facing mating exterior surface of the other server cell. In some instances, the electrical connectors can include contact connectors that provide electrical coupling through their physical contact with connectors on the opposing mating surface of another server cell, or contactless connectors that provide electrical coupling through induction or capacitive coupling when sufficiently close to corresponding contactless connectors on the opposing mating surface of another cell. The contact connectors can include, for example, metallized pads, spring-loaded connectors (e.g., pogo pins), pins, balls, metallized holes, and the like. In some embodiments, the contact connector on one server cell and its compatible contact connector on another server cell are both male connectors, such as both being spring-loaded connectors or a pin or ball that is brought into contact with a metalized pad when the two server cells are interlocked. In other embodiments, the contact connector on one server cell is a male connector (e.g., a pin) and its compatible contact connector on the other server cell is a female contact connector (e.g., a metalized hole). The electrical connectors disposed at the exterior surface of the server cell 200 can include a combination of contact connectors and contactless connectors. Moreover, in some embodiments, some or all of the electrical connectors at an exterior surface of the enclosure 250 may be implemented as part of the mechanical coupling assembly at that exterior surface. To illustrate, instead of disposing the electrical connectors 244 to the side of the male slide-fit coupling assembly 221, some or all of the electrical connectors 244 instead may be implemented on one or more surfaces of the male slide-fit coupling assembly 221, and the corresponding electrical connectors on the opposing surface of an adjacent server cell may be implemented at corresponding locations on the exterior surfaces of the female slide-fit coupling assembly 223 of the other server cell such that electrical connections are formed via the slide-fit coupling of the slide-fit coupling assembly 221 of one server cell with the slide-fit coupling assembly 223 of another server cell.

In addition to enabling signaling and power connections with adjacent server cells through the electrical connectors at the sides of the server cell 200, the server cell 200 can provide signaling or power connections with distant server cells (that is, server cells separated by one or more intervening server cells) through the use of the jumper interface 122, which may be coupled to the corresponding jumper interface of a distant server cell via a jumper cable 124 (see FIG. 1). This jumper configuration can be used to distribute either or both of supply voltages and signaling. The jumper interface 122 and the jumper cable 124 can implement one or more wires or optic fibers and implement any of a variety of standard or proprietary interface configurations, such as a universal serial bus (USB) standard, I2C standard, an Ethernet standard, and the like.

Figure 3:
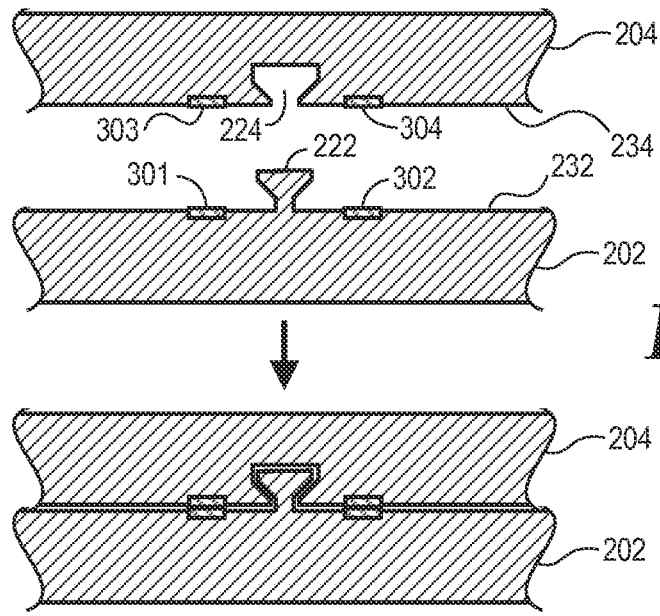
FIG. 3 is a cross-section view of compatible slide-fit coupling assemblies of facing mating surfaces of adjacent server cells in accordance with some embodiments.

FIG. 3 illustrates cross-section views of a process of interlocking two server cells employing slide-fit mechanical coupling in accordance with some embodiments. As depicted, the top side panel 202 of one server cell 200 (FIG. 2) is interlocked with the bottom side panel 204 of another server cell 200 via the male slide-fit connector assembly 222 of the top side panel 202 and the female slide-fit connector assembly 224 of the bottom side panel 204. The cross-section view illustrates a cross-section of these side panels 202 and 204 along the X-Z plane of FIG. 2. In this example, the top side panel 202 includes metal pad connectors 301 and 302 (one implementation of the electrical connectors) disposed at the exterior surface 232 and the bottom side panel 204 includes metal pad connectors 303 and 304 compatibly positioned at the exterior surface 234. When the two server cells 200 are mated together (e.g., slid together), the male slide-fit coupling assembly 222 and the female slide-fit coupling assembly 224 mechanically attach through friction forces, thereby removably mechanically coupling the two server cells together. Further, this coupling process aligns the metal pad connectors 301, 302, 303, and 304 such that the metal pad connectors 301 and 303 are brought into physical contact and the metal pad connectors 302 and 304 are brought into physical contact, and thus providing two electrical pathways between the compute components of one server cell and the compute components of the other server cell.

Figure 4:
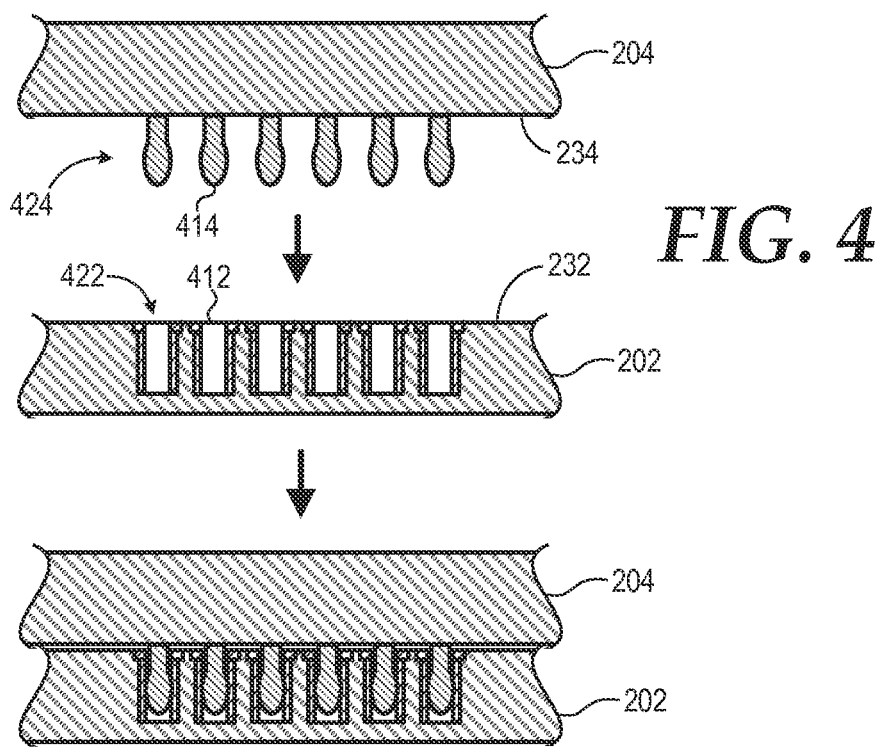
FIG. 4 is a cross-section view of compatible press-fit coupling assemblies of facing mating surfaces of adjacent server cells in accordance with some embodiments.

FIG. 4 illustrates cross-section views of a process of interlocking two server cells employing press-fit mechanical coupling in accordance with some embodiments. In this depiction, the top side panel 202 of one server cell 200 (FIG. 2) is interlocked with the bottom side panel of another server cell 200 via a female press-fit connector assembly 422 at the exterior surface 232 of the top side panel 202 and a male press-fit connector assembly 424 at the exterior surface 234 of the bottom side panel 204. The female press-fit connector assembly 422 includes a row or array of metalized holes 412 and the male press-fit connector assembly 424 includes a corresponding row or array of metal pins 414 which are compatibly dimensioned with the metalized holes 412 such that when the top side panel 202 and the bottom side panel 204 are mated together, the pins 414 are inserted into the corresponding metalized holes 412 and form a friction bond that removably mechanically couples the mated sections together, and thus mechanically attaches the two server cells together. Moreover, in this example the pins 414 and holes 412 also operate as electrical connectors through which signaling or supply voltages may be conducted between the two server cells.

Figure 5:
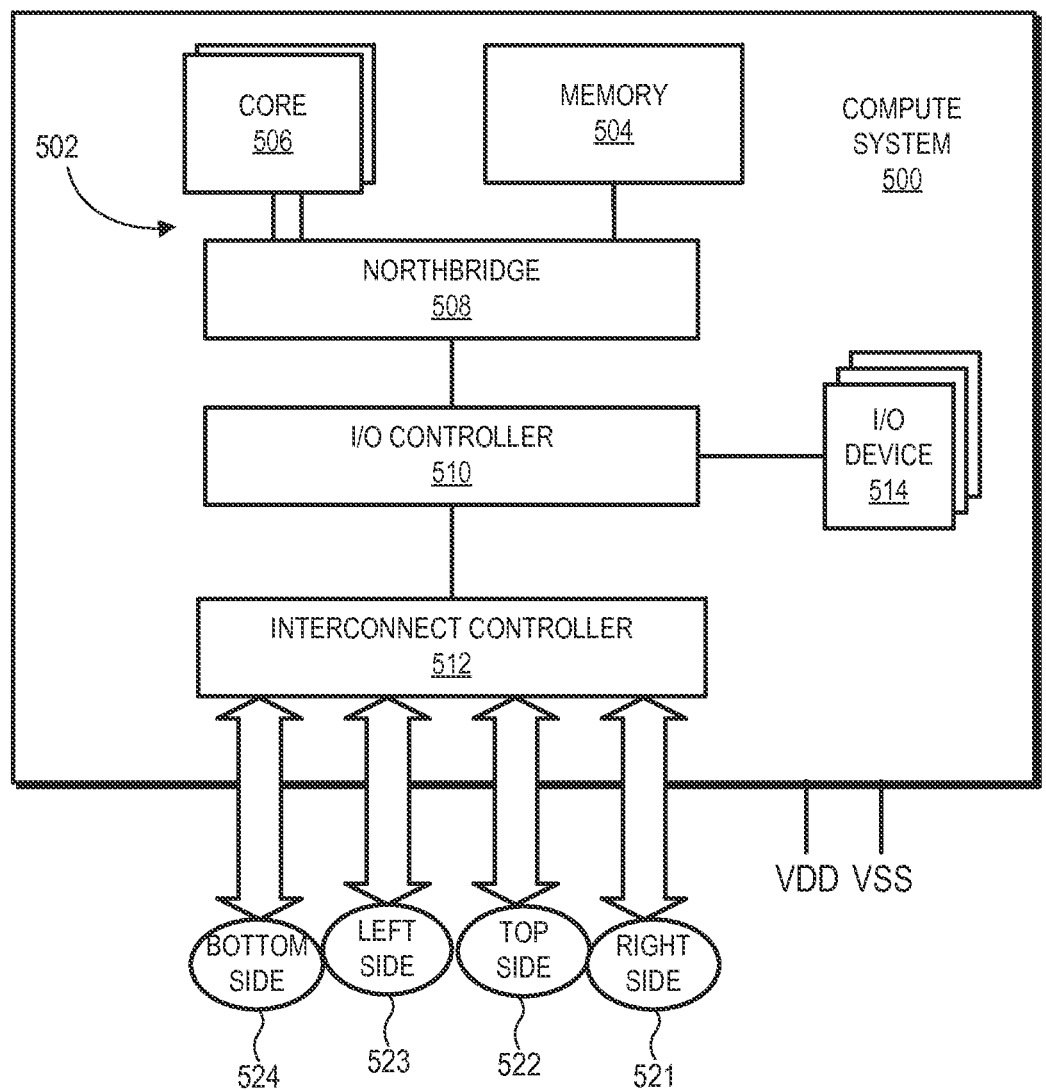
FIG. 5 is a block diagram illustrating a compute system of a server cell in accordance with some embodiments.

FIG. 5 is a block diagram illustrating an example compute system 500 implemented by the server cell 200 of FIG. 2 in accordance with some embodiments. In the depicted example, the compute system 500 includes various compute componentry (e.g., compute componentry 120 of FIG. 1), such as a processor 502, system memory 504, an I/O controller 510, an interconnect controller 512, and one or more I/O devices 514. The processor 502 includes one or more processor cores 506 and a northbridge 508. The one or more processor cores 506 can include any of a variety of types of processor cores, or combination thereof, such as a central processing unit (CPU) core, a graphics processing unit (GPU) core, a digital signal processing unit (DSP) core, and the like, and may implement any of a variety of instruction set architectures, such as an x86 instruction set architecture or an Advanced RISC Machine (ARM) architecture. The system memory 504 can include one or more memory modules, such as DRAM modules, SRAM modules, flash memory, or a combination thereof. The northbridge 508 interconnects the one or more cores 506, the system memory 504, and the I/O controller 510. The I/O controller 510 in turn operates to manage the I/O devices 514, which can include, for example, flash memory, disc drives, bus interfaces, display controllers, BIOS, or other peripheral devices.

The compute system 500 operates to execute an operating system (OS) and one or more software applications that perform compute tasks or other compute operations. In some embodiments, the compute system 500 may utilize a virtual machine manager (VMM) that virtualizes the hardware of the compute system 500 so as to allow multiple guest OS's and corresponding software applications to be executed by the compute system 500. In some instances, some or all of the server cells of the server system 100 each may perform discrete computing tasks in furtherance of an overall compute operation performed by the server system 100. In other instances, the server cells of the server system 100 may operate independently. In either mode of operation, the server cells may communicate data, commands, and other signaling via their respective interconnect controllers 512 and electrical connectors disposed on their mating exterior surfaces.

The interconnect controller 512 operates to manage inter-cell signaling conducted via the side panels of the enclosure 250 of the server cell 200. In this role, the interconnect controller 512 can operate in a manner similar to a router or a switch whereby the interconnect controller 512 routes signaling between the compute componentry of the compute system 500 and the electrical connectors of the side panels (illustrated as ports 521-524 in FIG. 5), as well as routing signaling between the electrical connectors of different side panels of the server cell 200. To illustrate, the interconnect controller 512 operates to route signaling received via a side panel and intended for the compute componentry of the server cell 200 by routing the received signaling from the side panel to the I/O controller 510, which then may forward the signaling on to other components as appropriate. Likewise, for signaling received from the I/O controller 510 and intended for an adjacent server cell (as either the next hop in the path or the final destination), the interconnect controller 512 can route the signaling from the I/O controller 510 to the electrical connectors at the side panel that is mated to the intended adjacent server cell. Further, the interconnect controller 512 can operate as a forwarding mechanism whereby it forwards signaling received from one adjacent server cell to another adjacent server cell, or as a reflection mechanism whereby it receives signaling received from an adjacent server cell via one set of electrical connectors and then reflects that signaling back to the same adjacent server cell via another set of electrical connectors.

As noted above, the supply voltages (e.g., voltages VDD and VSS) used to power the compute componentry of the server cells can be distributed among the server cells via the inter-cell connectors. In such instances, the server cell 200 can include fixed or programmable wiring (not shown) that routes supply voltages received via inbound power connectors at one side panel to outbound power connectors at one or more other side panels, and thus forwarding the supply voltages on to other adjacent server cells. This intra-cell power distribution wiring can be provides as metal vias, metal traces, and other conductive features of PCB segments that can form the side panels of the server cell 200, as cabling spanning between the interior surfaces of the side panels of the server cell 200, or combinations thereof.

Figure 6:
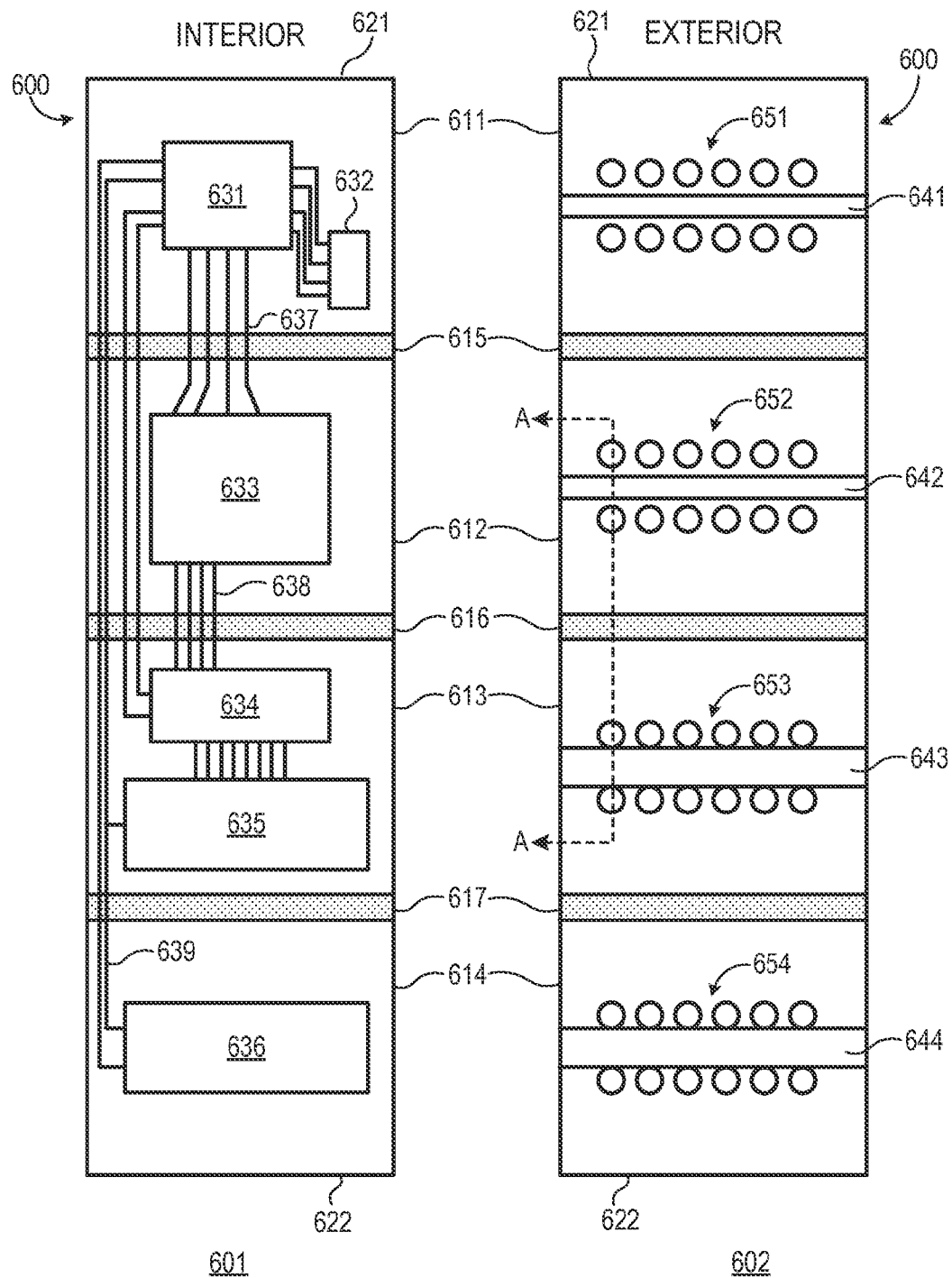
FIG. 6 is a top view and a bottom view of a printed circuit board (PCB) assembly that forms at least some of the panels of an enclosure of a server cell in accordance with some embodiments.
Figure 7:
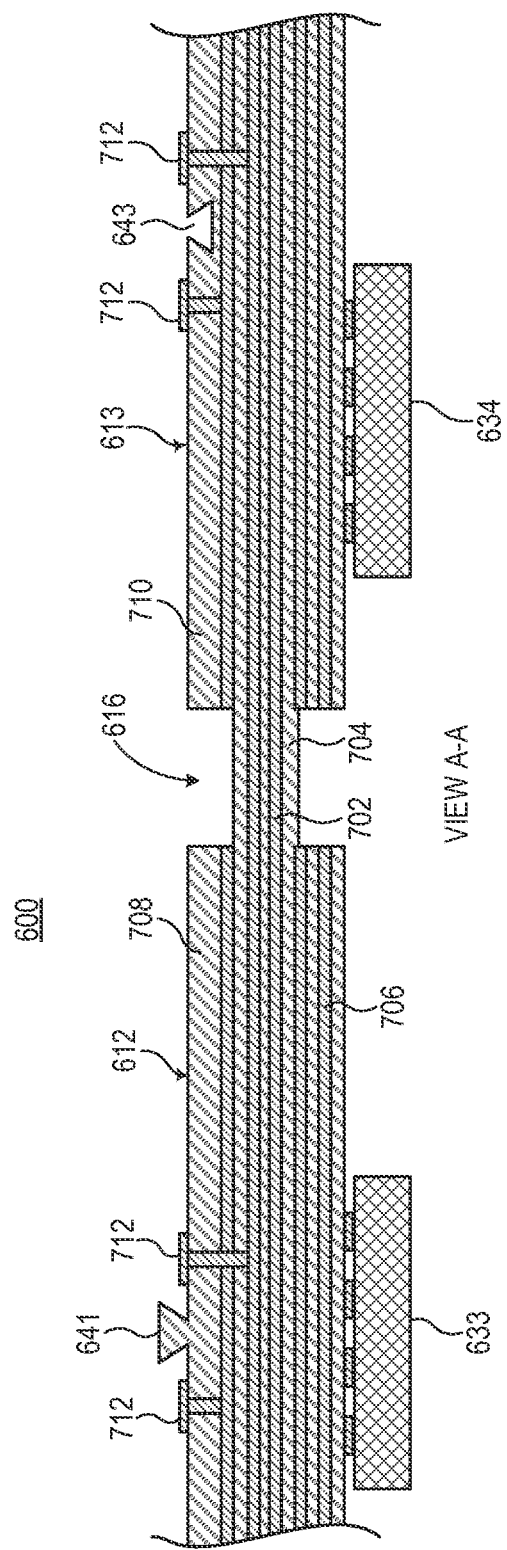
FIG. 7 is a cross-section view of a portion of the PCB assembly of FIG. 6 in accordance with some embodiments.

FIGS. 6 and 7 illustrate a rigid-flex PCB assembly 600 used to fabricate a server cell in accordance with some embodiments. As illustrated by the top view 601 and bottom view 602 of the rigid-flex PCB assembly 600 presented in FIG. 6, the rigid-flex PCB assembly 600 includes four rigid PCB sections 611, 612, 613, and 614 connected via intervening flexible PCB sections 615, 616, and 617. The rigid PCB sections 611-614 are fabricated so as to be relatively rigid and thus not substantially flex or otherwise deform under normal loading. The flexible PCB sections 615-617 are fabricated so as to be relatively flexible and thus allow the rigid-flex PCB assembly 600 to be folded into the hollow cuboid shape of the enclosure 250 illustrated in FIG. 2. So folded, the rigid PCB sections 611-614 form the side panels 201-204 (FIG. 2) of the server cell 200, and the flexible PCB sections 615-617 form the three corners that join, for example, the side panels 201, 202, and 203. The top edge 621 and the bottom edge 622 of the rigid-flex PCB assembly 600 may be joined together via adhesive, thermal bonding, right-angle bracing, and the like, so as to form the fourth corner that joins, for example, the side panels 201 and 204. With the rigid-flex PCB assembly 600 thus folded and the edges 621 and 622 joined, the rigid-flex PCB assembly 600 forms the enclosure 250 of the server cell 200. The rigidity of the folded rigid-flex PCB assembly 600 can be augmented through the use of for example, L-braces or corner braces at one or more corners, struts or other support rods that extend from the interior surface of one side panel to the interior surface of another side panel, and the like.

Top view 601 illustrates a plan view of the interior side of the rigid-flex PCB assembly 600; that is, the side of the rigid-flex PCB assembly 600 that forms the interior of the server cell 200 when folded. As illustrated by top view 601, various compute componentry may be disposed at the interior side of one or more of the rigid PCB segments 611-614, and connected via metal traces, vias, through holes, and other conductive structures formed in the rigid-flex PCB assembly 600. In the depicted example, this compute componentry includes: a jumper interface 632 (one example of the jumper interface 122 of FIG. 2) and an integrated circuit (IC) device 631 disposed at the rigid PCB segment 611; an IC device 633 disposed at the rigid PCB segment 612; IC devices 634 and 635 disposed at the rigid PCB segment 613; and an IC device 636 disposed at the rigid PCB segment 614. These components are interconnected via metal traces (e.g., metal traces 637, 638, and 639), vias, metal through holes, and other metal features of the rigid-flex PCB assembly 600. With respect to the illustrated configuration of the compute system 500 of FIG. 5, the IC device 631 can implement, for example, the interconnect controller 512, the IC device 633 can implement, for example, the one or more processor cores 506 and the northbridge 508, the IC device 634 can implement, for example, the memory 504, the IC device 633 can implement, for example, the I/O controller 510, and the IC device 636 can implement, for example, a voltage regulator, a peripheral device, and the like.

Bottom view 602 of FIG. 6 illustrates a plan view of the exterior side of the rigid-flex PCB assembly 600; that is, the side of the rigid-flex PCB assembly that forms the exterior mating surfaces of the enclosure 250 of the server cell 200 when folded. In this example, female slide-fit coupling assemblies 641 and 642 are formed at the exterior mating surfaces of the rigid PCB sections 611 and 612, respectively, and male slide-fit coupling assemblies 643 and 644 are formed at the exterior mating surfaces of the rigid PCB sections 613 and 614, respectively. The female slide-fit coupling assemblies 641 and 642 can correspond to, for example, the female slide-fit coupling assemblies 223 and 224 of FIG. 2, and the male slide-fit coupling assemblies 643 and 644 can correspond to, for example, the male slide-fit coupling assemblies 221 and 222 of FIG. 2. Also disposed at the exterior mating surfaces of the rigid PCB sections 611-614 are sets 651, 652, 653, and 654, respectively, of electrical connectors. These electrical connectors can comprise contact connectors, contactless connectors, or a combination thereof, and may be used to distribute signaling or supply voltages. Thus, when folded into the cuboid shape illustrated by the server cell 200 of FIG. 2, each exterior surface of the perimeter formed by the folded rigid-flex PCB assembly 600 provides a mating surface that can mechanically and electrically couple with a compatible mating surface of an adjacent server cell.

Cross-section view 700 of FIG. 7 illustrates a cross-section view of the rigid PCB sections 612 and 613 and the flexible PCB section 616 of the rigid-flex PCB assembly 600 along line A-A in FIG. 6. As shown, the rigid-flex PCB assembly 600 comprises one or more metal layers and one or more dielectric layers (e.g., metal layer 702 and dielectric layer 704) that extend the length of the rigid-flex PCB assembly 600 (from edge 621 to edge 622), and thus providing electrical and mechanical continuity between all of the rigid PCB segments 611-614. The rigid PCB segments 611-614 further include one or more additional metal layers and one or more additional dielectric layers (e.g., metal layer 706 and dielectric layer 708) to provide intra-segment connectivity and to provide structural support to the corresponding rigid PCB segment in its role as a side panel or "wall" of the server cell 200 (FIG. 2).

For the flexible PCB section 616 to fulfill its role as the folding crease that allows the rigid PCB sections 612 and 613 to be positioned orthogonally to each other, the metal and dielectric layers present in the flexible PCB section 616 should be relatively flexible so as to permit this folding. To this end, the layer materials and thicknesses of the layers in the flexible PCB section 616 are selected to provide this flexibility. To illustrate, the flexible PCB section 616 can comprise interleaved layers of ½ ounce copper foil for the metal layers and thin layers of flexible adhesives and thin polyimide films (e.g., DuPont™ Kapton™ film) for the dielectric layers. For the rigid. PCB sections 612 and 613 to fulfill their role as the rigid walls of the server cell 200, the rigid PCB sections 612 and 613 may build on the base metal and dielectric layers forming the flexible PCB section 616 with more rigid layer of dielectric material that are made relatively rigid based on the material type or their thicknesses. For example, the additional dielectric layers found in the rigid PCB sections 612 and 613 can include one or more layers of core or prepreg FR4 glass-reinforced epoxy laminate, as well as layers of adhesives, polyimides, and other suitable dielectric materials. In some embodiments, the flexible PCB section 616 may be formed by fabricating all of the various metal and dielectric layers for the PCB assembly 600 to as to extend fully from the edge 621 to the edge 622 (FIG. 6) and then remove portions of the appropriate layers in the region corresponding to the flexible PCB section 616 through an etch, ablation, or abrasive process so that only the intended layers remain in the flexible PCB section 616. The other flexible PCB sections 615 and 617 may be similarly formed.

In the example of FIG. 7, the male slide-fit connector assembly 641 is formed by molding or extruding its shape at the top dielectric layer 708 or by preforming the male slide-fit connector assembly 641 and then adhering the male slide-fit connector assembly 641 to the top dielectric layer 708. The female slide-fit connector assembly 643 can be formed as an intrusion at a top layer 710 of the rigid PCB section 613 via an etch, ablation, or abrasive process. Further, in the depicted example, the electrical connectors of the sets 652 and 654 (FIG. 6) are illustrated as metalized pads 712 intended to physically contact corresponding metal pads on an opposing mating surface of another server cell so as to form electrical pathways between the two adjacent server cells.

Figure 8:
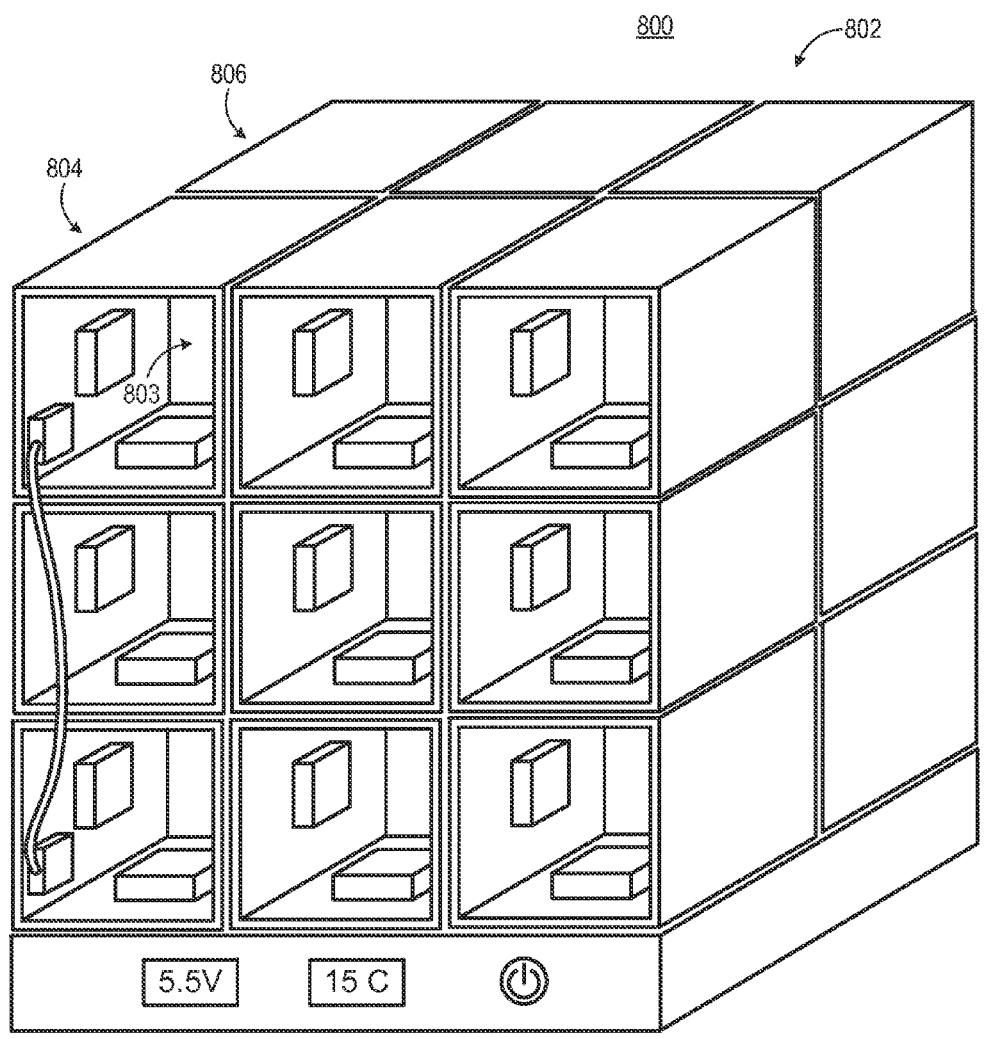
FIG. 8 is a perspective view of a cell-based server system comprising a three-dimensional array of server cells in accordance with some embodiments.

FIG. 8 illustrates a server system 800 employing a three-dimensional (3D) array 802 of server cells in accordance with some embodiments. In the depicted implementation, in addition to employing four mating surfaces that form a perimeter in the X-Y plane as shown by the server system 100 of FIG. 1, the server cells of the server system 800 include a back side panel 803 with compatible mating surfaces, thereby enabling the server system 800 to interconnect server cells in two ranks, ranks 804 and 806, each rank comprising a 2D array of server cells. The server cell in one rank may be interconnected with the corresponding server cell in another rank via, for example, compatible press-fit coupling assemblies on the exterior mating surfaces of the back side panels 803 of the adjacent server cells. In other embodiments, the server cells also may include front side panels (not shown) so as to provide a total of six orthogonal mating surfaces for the cuboid shape illustrated. In such configurations, a server system can be expanded to include more than two ranks of 1D or 2D server cell arrays.

Figure 9:
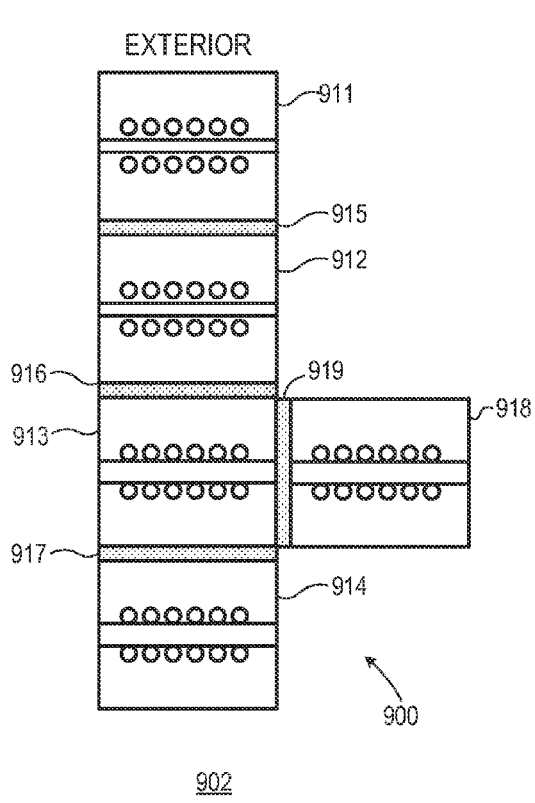
FIG. 9 is a top view of a PCB assembly that forms five side panels of an open-front cuboid server cell in accordance with some embodiments.
Figure 10:
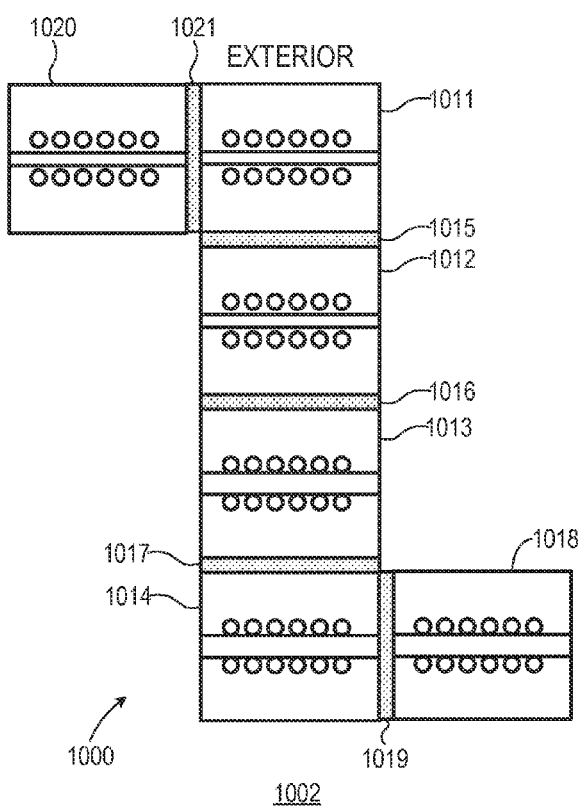
FIG. 10 is a top view of a PCB assembly that forms six side panels of a fully-enclosed cuboid server cell in accordance with some embodiments.

FIGS. 9 and 10 illustrate example rigid-flex PCB assembly configurations that may be used to form server cells with five or six orthogonal mating surfaces. FIG. 9 illustrates a bottom view 902 of a rigid-flex PCB assembly 900 having four rigid PCB sections 911, 912, 913, and 914 joined via flexible PCB sections 915, 916, and 917 so as to form a perimeter of side panels of a cuboid server cell when folded along the creases formed by the flexible PCB sections 915-917. Further, the rigid-flex PCB assembly 900 has a fifth rigid PCB section 918 connected to an edge of the rigid PCB section 913 (or another one of the rigid PCB sections) via a flexible PCB section 919 such that when the rigid PCB section 918 is folded along the flexible PCB section 919 and joined to the adjacent edges of the other rigid PCB sections, the rigid PCB section 918 forms a back side panel of the resulting server cell. FIG. 10 illustrates a bottom view 1002 of a rigid-flex PCB assembly 1000 having four rigid PCB sections 1011, 1012, 1013, and 1014 joined via flexible PCB sections 1015, 1016, and 1017 so as to form a perimeter of side panels of a cuboid server cell when folded along the creases formed by the flexible PCB sections 1015-1017. Further, the rigid-flex PCB assembly 1000 has a fifth rigid PCB section 1018 connected to an edge of the rigid PCB section 1014 (or another one of the rigid PCB sections) via a flexible PCB section 1019 and a sixth rigid PCB section 1020 connected to an edge of the rigid PCB section 1011 (or another one of the rigid PCB sections) via a flexible PCB section 1021 such that when the rigid-flex PCB assembly 1000 is folded along the flexible PCB sections, the rigid PCB sections 1018 and 1020 form a back side panel and a front side panel, respectively, of the resulting server cell.

Figure 11:
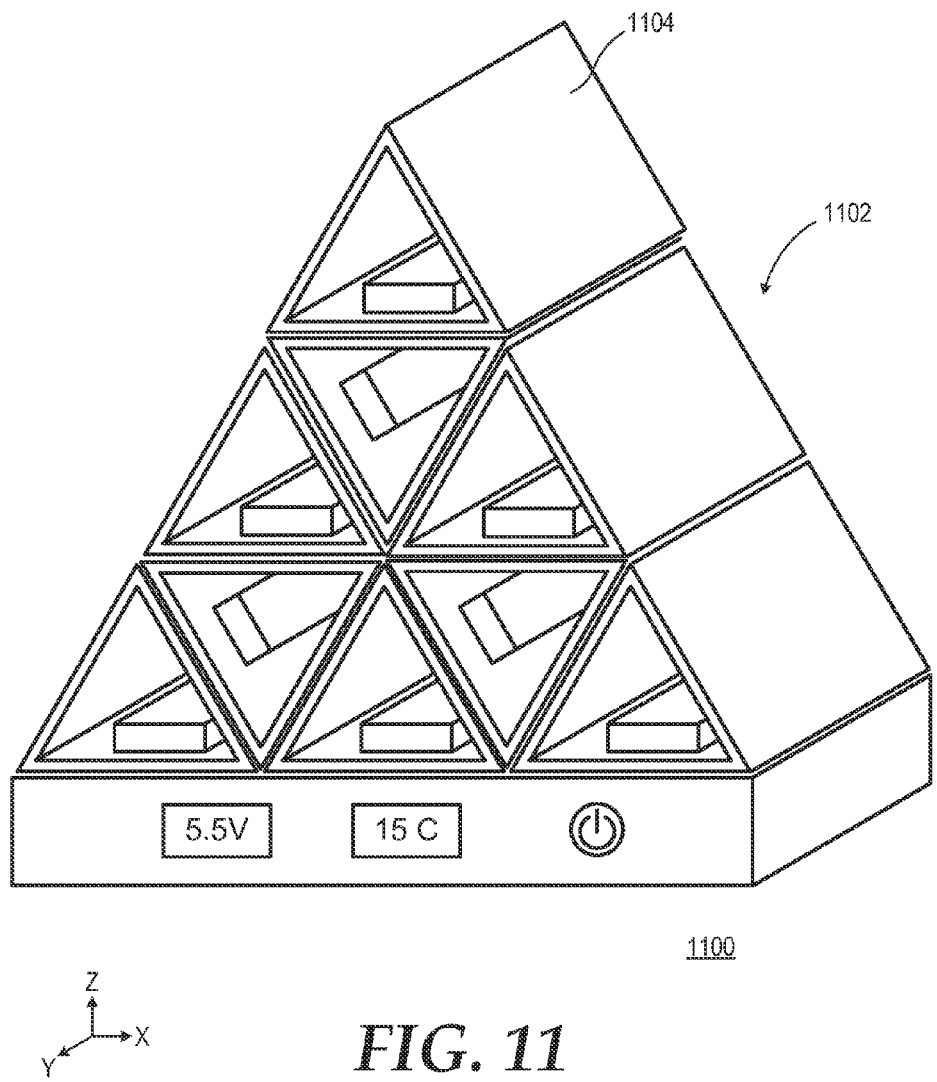
FIG. 11 is a perspective view of a server system comprising a two-dimensional array of server cells with triangular prism enclosures in accordance with some embodiments.
Figure 12:
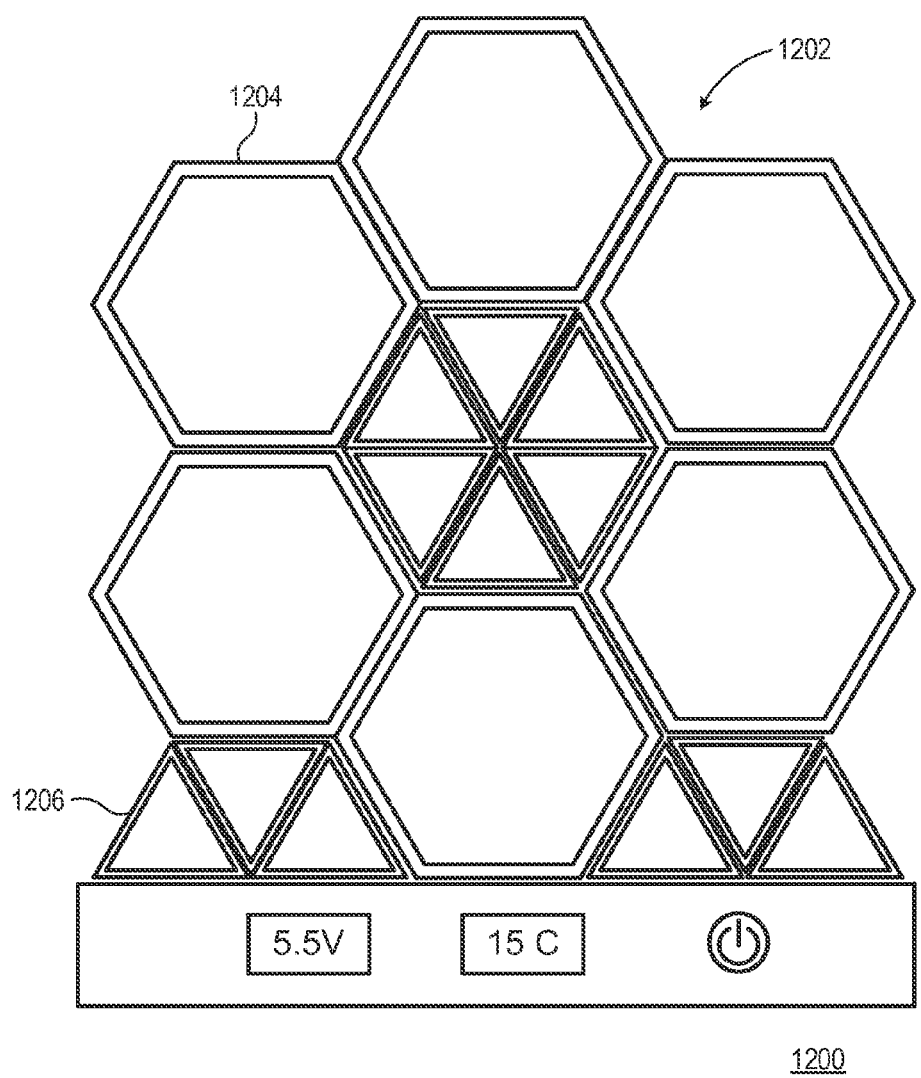
FIG. 12 is a front view of a server system comprising a hybrid two-dimensional array of server cells with triangular prism enclosures and server cells with hexagonal prism enclosures in accordance with some embodiments.

Although FIGS. 1-10 illustrate example implementations of server cells with cuboid shapes, the server cells can have any of a variety of 3D shapes capable of supporting expandable multiple-cell configurations. To illustrate, FIG. 11 illustrates a perspective view of a server system 1100 employing a 2D array of server cells 1104 having an enclosure with a triangular prism shape. Moreover, a server system may incorporate a combination of server cells of different shapes or types. As an example, FIG. 12 illustrates a front view of a server system 1200 employing a 2D hybrid array of server cells 1204 with enclosures having a hexagonal prism shape and server cells 1206 having a triangular prism shape. As another example, the server cells may be formed with an octagonal prism shape. As with the cuboid server cell 200 of FIG. 2, the server cells 1104, 1204, and 1206 may be formed so as to be open at one or both of the front or back sides to as to facilitate air flow and, in the case of an open front side, to enable front-side access to the interior of the server cells. Moreover, the server cells 1104, 1204, and 1206 may be formed using a folded flex-rigid PCB assembly fabricated in a manner similar to that described above with respect to FIGS. 6, 7, and 10.

Figure 13:
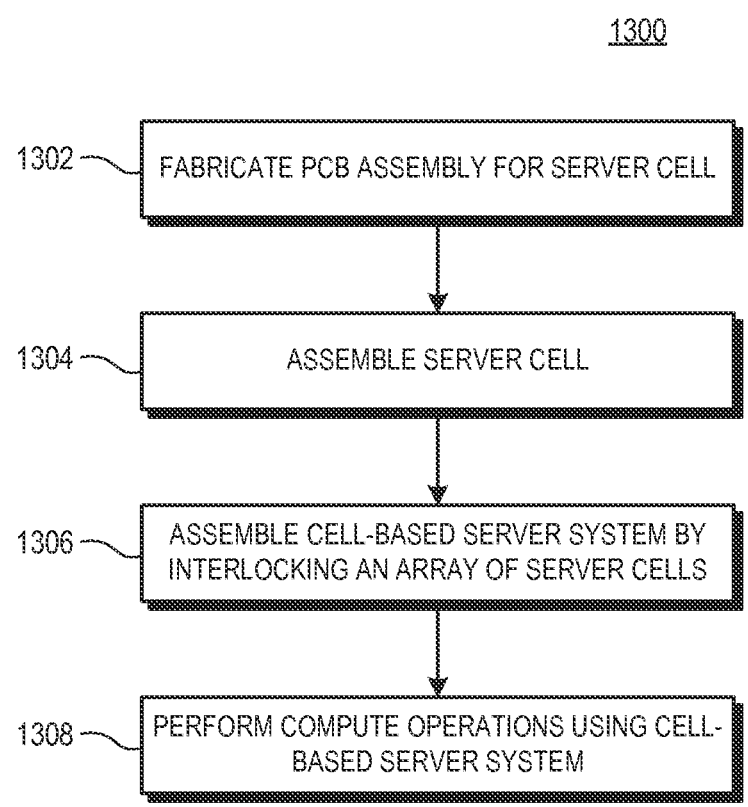
FIG. 13 is a flow diagram illustrating a method for fabricating and operating a cell-based server system in accordance with some embodiments.

FIG. 13 illustrates a method 1300 for assembling and operating a cell-based server system in accordance with some embodiments. For ease of illustration, the method 1300 is described below in an example context of the server system 100 of FIG. 1 utilizing open-ended cuboid-shaped server cells 200 as illustrated in FIG. 2. At block 1302, a rigid-flex PCB assembly is fabricated for each of a plurality of server cells. This fabrication process can include fabrication of a PCB substrate with the appropriate metal and dielectric layers, etching, ablating or otherwise removing material to form the flexible PCB sections, attaching the compute components at the resulting rigid PCB sections, attaching the electrical connectors to the exterior mating surfaces of the rigid PCB sections, and forming or attaching the compatible mechanical coupling assemblies to the exterior mating surfaces. At block 1304, the rigid-flex PCB assembly is folded to form a corresponding server cell. As part of this folding process, adjacent unattached edges of the rigid PCB sections may be attached via adhesive, thermobonding, brackets, screws, clamps, etc. The process of blocks 1302 and 1304 is repeated to generate a plurality of server cells.

At block 1306, the plurality of server cells are interlocked to form a 1D, 2D, or 3D server cell array. This interlocking process includes joining facing mating surfaces of the server cells either by sliding the server cells together or pressing the server cells together, depending on the mechanical coupling mechanism employed. The interlocking process also can include connecting a base of the server cell array to a chassis, which may serve as both a stabilizing base for the server cell array as well as an ingress point for one or more supply voltages and an ingress or egress point for one or more signals. With the server system assembled, at block 1308 the server system is operated to perform one or more compute operations. In some embodiments, the compute operations can include discrete sub-operations performed in parallel in furtherance of an overall compute operation (e.g., scientific modeling operations, graphics rendering, etc.). Alternatively, the compute operations can include independent compute operations performed by separate sets of one or more of the server cells (e.g., each set of server cells operating as a separate virtual server in support of a separate client). As part of this operation, supply voltages are distributed among the server cells via the paired electrical connectors at the mating surfaces of the server cells. Likewise, signaling of data, commands, and other information is distributed among the server cells via the paired electrical connectors at the mating surfaces of the server cells. Additionally, jumper cable interfaces may be implemented to provide direct signal connections or voltage supply connections between server cells that are not immediately adjacent to each other.

In some embodiments, at least some of the functionality described above may be implemented by one or more processors executing one or more software programs tangibly stored at a computer readable medium, and whereby the one or more software programs comprise instructions that, when executed, manipulate the one or more processors to perform one or more functions described above. In some embodiments, the components and techniques described above are implemented in a system comprising one or more electronic devices. Electronic design automation (EDA) and computer aided design (CAD) software tools may be used in the design and fabrication of these electronic devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an electronic device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer sys em via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A server system comprising:
    an array of server cells, each server cell of at least a subset of the array comprising:
        a single printed circuit board (PCB) comprising a set of at least three rigid PCB sections interconnected via flexible PCB sections, and comprising a set of one or more metal traces extending between at least two of the rigid PCB sections via at least one of the flexible PCB sections, the single PCB folded at the flexible PCB sections to form an enclosure for the server cell;
        a first compute component disposed at an interior surface of a first rigid PCB section of the set of rigid PCB sections, the first compute component coupled to at least one metal trace of the set of one or more metal traces and comprising at least one processor core; and
        wherein at least one rigid PCB section of each server cell is removably mechanically coupled and removably electrically coupled to a facing rigid PCB section of an adjacent server cell of the array of server cells.

2. The server system of claim 1, wherein at least one server cell is open at one or both sides orthogonal to the set of rigid PCB sections of the server cell.

3. The server system of claim 1, wherein an exterior surface of each of at least two of the rigid PCB sections comprises:
    a first set of one or more electrical connectors to conduct signaling between the first compute component and corresponding electrical connectors at a facing exterior surface of an adjacent server cell mechanically coupled to the server cell.

4. The server system of claim 3, wherein at least one of the first set of one or more electrical connectors is a contactless connector.

5. The server system of claim 3, wherein an exterior surface of each of at least two of the rigid PCB sections comprises:
    a second set of one or more electrical connectors to conduct one or more supply voltages.

6. The server system of claim 3, wherein the exterior surface of each of at least two of the set of rigid PCB sections further comprises a mechanical coupling assembly to mechanically couple the exterior surface to a facing exterior surface of an adjacent server cell.

7. The server system of claim 6, wherein the mechanical coupling assembly comprises at least one of: a male slide-fit connector; a female slide-fit connector; a press-fit male connector; a press-fit female connector; a hook element; a loop element; a magnetic element; a clamp element; and a bolt element.

8. The server system of claim 1, further comprising:
    a jumper cable electrically coupling two server cells that are separated in the array by at least one other server cell.

9. The server system of claim 1, wherein the array of server cells is one of: a two-dimensional array of server cells; and a three-dimensional array of server cells.

10. The server system of claim 1, wherein the array of server cells is self-supporting.

11. The server system of claim 1, further comprising:
    a second compute component disposed at an interior surface of a second rigid PCB section of the set of rigid PCB sections; and
    wherein the first compute component and the second compute component are interconnected via one or more metal traces of the set of one or more metal traces.

12. A server cell comprising:
    a first compute component comprising at least one processor core; and
    a single printed circuit board (PCB) comprising a set of three or more rigid PCB sections interconnected via flexible PCB sections, and comprising a set of one or more metal traces extending between at least two of the rigid PCB sections via at least one of the flexible PCB sections, the single PCB folded at the flexible PCB sections to form an enclosure of the server cell, wherein at least one metal trace of the set of one or more metal traces is coupled to the first compute component and wherein an exterior surface of each of at least two rigid PCB sections comprises:
        a first set of one or more electrical connectors to conduct signaling; and
        a mechanical coupling assembly to mechanically couple the exterior surface to an exterior surface of an adjacent server cell.

13. The server cell of claim 12, wherein the server cell is open at one or both sides orthogonal to the set of rigid PCB sections.

14. The server cell of claim 12, wherein the set of rigid PCB sections is selected from a group consisting of: three rigid PCB sections forming a triangular prism enclosure; four rigid PCB sections forming a cuboid enclosure; six rigid PCB sections forming a hexagonal prism enclosure; and eight rigid PCB sections forming an octagonal prism enclosure.

15. The server cell of claim 12, wherein the exterior surface of each of at least two rigid PCB sections comprises:
    a second set of one or more electrical connectors to conduct one or more supply voltages.

16. The server cell of claim 12, wherein the first set of one or more electrical connectors comprises at least one contactless connector.

17. The server cell of claim 16, wherein the at least one contactless connector includes at least one induction-coupled contactless connector.

18. The server cell of claim 12, further comprising:
    an interconnect controller coupled to the first set of electrical connectors of each of the at least two rigid PCB sections, the interconnect controller to route signaling between electrical connectors of one rigid PCB section to another rigid PCB section and between electrical connectors of the rigid PCB sections and the first compute component.

19. The server cell of claim 12, further comprising:
    a second compute component; and
    wherein the first compute component and the second compute component are interconnected via one or more metal traces of the set of one or more metal traces.

20. A server cell comprising:
a first compute component comprising at least one processor core;
a set of three or more rigid printed circuit board (PCB) sections forming an enclosure of the server cell, wherein an exterior surface of each of at least two rigid PCB sections comprises:
- a first set of one or more electrical connectors to conduct signaling; and
- a mechanical coupling assembly to mechanically couple the exterior surface to an exterior surface of an adjacent server cell; and a rear panel orthogonal to the set of rigid PCB sections, an exterior surface of the rear panel comprising:
- a set of one or more electrical connectors to conduct signaling; and
- a mechanical coupling assembly to mechanically couple the exterior surface of the rear panel to an exterior surface of a facing panel of an adjacent server cell.

21. A method comprising:
providing a server system comprising an interlocked array of server cells, each server cell comprising:
- a compute component comprising at least one processor core; and
- a single printed circuit board (PCB) comprising a set of at least three rigid PCB sections interconnected via flexible PCB sections, and comprising a set of one or more metal traces extending between at least two of the rigid PCB sections via at least one of the flexible PCB sections, the single PCB folded at the flexible PCB sections to form an enclosure for the server cell;
- wherein at least one metal trace of the set of one or more metal traces is coupled to the compute component; and
- wherein at least one rigid PCB sections of each server cell is mechanically and electrically coupled to a rigid PCB section of an adjacent server cell of the array of server cells.

22. The method of claim 21, further comprising:
performing a compute operation at the server system, the compute operation including a transmission of data from the compute component of a first server cell to the compute component of a second server cell adjacent to the first server cell via signaling conducted from a first electrical connector at an exterior surface of a rigid PCB section of the first server cell to a second electrical connector at an exterior surface of a rigid PCB section of the second server cell.

23. The method of claim 21, further comprising:
performing a compute operation at the server system, the compute operation including a transmission of data from the compute component of a first server cell to the compute component of a second server cell via signaling routed from an electrical connector at an exterior surface of one rigid PCB section of a third server cell to an electrical connector at an exterior surface of another rigid PCB section of the third server cell.

24. The method of claim 21, wherein providing the server system comprises:
interlocking the array of server cells to connect the server cells in a logical network, the logical network comprising one of: a ring network; a hub-and-spoke network; a torus network; and a mesh network.

\* \* \* \* \*